(12) United States Patent
Rabinowitz (10) Patent No.: US 7,501,572 B1
(45) Date of Patent: Mar. 10, 2009

(54) SOLAR PHOTOVOLTAIC CELL SYSTEM TRACKS THE SUN FOR INCREASED EFFICIENCY

(76) Inventor: Mario Rabinowitz, 715 Lakemead Way, Redwood City, CA (US) 94062

( * ) Notice: Subject to any disclaimer, the term of this patent is extended or adjusted under 35 U.S.C. 154(b) by 0 days.

(21) Appl. No.: 11/968,160

(22) Filed: Dec. 31, 2007

(51) Int. Cl.
*H01L 31/042* (2006.01)

(52) U.S. Cl. .................................. 136/246; 250/203.4

(58) Field of Classification Search ................ 136/246; 250/203.4; 126/569–713
See application file for complete search history.

(56) References Cited

U.S. PATENT DOCUMENTS

| | | | | |
|---|---|---|---|---|
| 4,137,098 | A * | 1/1979 | Field | 136/248 |
| 4,210,463 | A * | 7/1980 | Escher | 136/246 |
| 4,304,955 | A * | 12/1981 | Meckler | 136/259 |
| 4,968,355 | A | 11/1990 | Johnson | |
| 5,675,487 | A * | 10/1997 | Patterson et al. | 700/56 |
| 6,197,228 | B1 | 3/2001 | Sheridon | |
| 6,211,998 | B1 | 4/2001 | Sheridon | |
| 6,262,707 | B1 | 7/2001 | Sheridon | |
| 6,542,283 | B1 | 4/2003 | Sheridon | |
| 6,698,693 | B2 | 3/2004 | Davidson | |
| 6,957,894 | B2 | 10/2005 | Rabinowitz | |
| 6,959,993 | B2 | 11/2005 | Gross et al. | |
| 6,964,486 | B2 | 11/2005 | Rabinowitz | |
| 6,975,445 | B1 | 12/2005 | Rabinowitz | |
| 6,988,809 | B2 | 1/2006 | Rabinowitz | |
| 7,077,361 | B1 | 7/2006 | Rabinowitz | |
| 7,115,881 | B2 | 10/2006 | Rabinowitz | |
| 7,130,102 | B2 | 10/2006 | Rabinowitz | |
| 7,133,183 | B2 | 11/2006 | Rabinowitz | |
| 7,156,088 | B2 | 1/2007 | Luconi | |
| 7,187,490 | B2 | 3/2007 | Rabinowitz | |
| 7,192,146 | B2 | 3/2007 | Gross et al. | |
| 7,247,790 | B2 | 7/2007 | Rabinowitz | |
| 2007/0251569 | A1 * | 11/2007 | Shan et al. | 136/246 |

FOREIGN PATENT DOCUMENTS

WO    PCT/US02/20199    6/2002

OTHER PUBLICATIONS

"Reliance Electric Website"; http://www.reliance.com/mtr/mtrhrmn.htm from Oct. 12, 2001, available from www.archive.org. 39 pages.*

* cited by examiner

*Primary Examiner*—Nam X Nguyen
*Assistant Examiner*—Jeffrey T Barton (57) ABSTRACT

This invention deals with novel method and apparatus for positioning and motion control of a solar cell system that tracks the sun or other light source. This achieves an advantageous increase in output power. The torque to produce angular deflection, and rotational motion is provided separately by an induced and/or permanent dipole coupling to an electronic grid. Thus forces and torques are produced without the use of internal moving parts such as in motors. The instant invention exceeds the capability of conventional systems. It is suited for maximization of solar energy with an ideally low-profile tracking solar cell array. Since there are no motors or other heavy and expensive equipment, the instant invention provides less costly and greater ease of manufacture, transportation, and installation. Dynamic motion can be controlled over a wide range of dimensions from micrometers to decimeters.

20 Claims, 6 Drawing Sheets

SOLAR PHOTOVOLTAIC CELL SYSTEM TRACKS THE SUN FOR INCREASED EFFICIENCY

FIELD OF THE INVENTION

The instant invention relates generally to a Solar Photovoltaic Cell System that tracks the sun by means of an Induced Dipole Alignment of small solar cells that are supported by universal pivot points that are above the solar cells, below the solar cells, or internal to the solar cells. The solar cells are mounted on universal pivots that can rotate or tilt in any direction; or are on a gimbaled system.

BACKGROUND OF THE INVENTION

This invention provides a better means to achieve affordable solar energy than by a conventional stationary solar cell array, or one that tracks the sun by means of motors and gears. In the latter, enabling the solar cells to be movable generally requires many large heavy motors that consume a great deal of power, and are tracking angle limited. Although such a tracking solar cell system would be more efficient in collecting the sun's energy to convert to electricity, it would be an expensive, bulky, and ponderous system that is unfavorable for rooftop and other applications where much weight cannot be tolerated.

In the instant invention, the angular alignment of the solar cells is accomplished by lightweight Induced Dipole Alignment of the solar cells rather than with cumbersome motors. Induced dipole alignment for rotation is described and taught in detail in U.S. Pat. No. 6,964,486, "Alignment of Solar Concentrator Micro-Mirrors" by Mario Rabinowitz, issued on Nov. 15, 2005; and U.S. Pat. No. 7,187,490, "Induced Dipole Alignment Of Solar Concentrator Balls" by Mario Rabinowitz, issued on Mar. 6, 2007. As described in these patents, the electric dipole can be induced in metallic conductors and/or in the dielectrics.

DESCRIPTION OF THE PRIOR ART

No prior art was found related to Induced Dipole Alignment of pivoted solar cells that to track the sun in order to convert more sunlight into electricity. Nor was any prior art found that utilized the internal pivot point ability of the instant invention to rotate planar solar cells and similar configurations in place without the need for an affixed or suspended pivot. Furthermore, the instant invention can be operated without need of containment by concentric cavities or an egg crate structure. Furthermore, the pivoted structure of the instant invention permits operation with minimal confinement, and if desired can operate in air. Having the pivot point above the solar cells has the additional advantage of vertical stability because the center of mass is below the pivot suspension point. Vertical stability provides a natural fiducial or starting point, as well as enabling simpler and more efficient alignment. None of the prior art has these features.

INCORPORATION BY REFERENCE

Adjustable solar cells are an important feature of a solar cell system that tracks the sun. The following U.S. patents, and Solar Journal publication are fully incorporated herein by reference as relates to the adjustable solar cell system.

1. U.S. Pat. No. 7,247,790 by Mario Rabinowitz, "Spinning Concentrator Enhanced Solar Energy Alternating Current Production" issued on Jul. 24, 2007.
2. U.S. Pat. No. 7,187,490 by Mario Rabinowitz, "Induced Dipole Alignment Of Solar Concentrator Balls" issued on Mar. 6, 2007
3. U.S. Pat. No. 7,133,183 by Mario Rabinowitz, "Micro-Optics Solar Energy Concentrator" issued on Nov. 7, 2006.
4. U.S. Pat. No. 7,130,102 by Mario Rabinowitz, "Dynamic Reflection, Illumination, and Projection" issued on Oct. 31, 2006.
5. U.S. Pat. No. 7,115,881 by Mario Rabinowitz and Mark Davidson, "Positioning and Motion Control by Electrons, Ions, and Neutrals in Electric Fields" issued on Oct. 3, 2006.
6. U.S. Pat. No. 7,112,253, by Mario Rabinowitz, "Manufacturing Transparent Mirrored Mini-Balls for Solar Energy Concentration and Analogous Applications" issued on Sep. 26, 2006.
7. U.S. Pat. No. 7,077,361, by Mario Rabinowitz, "Micro-Optics Concentrator for Solar Power Satellites" issued on Jul. 18, 2006.
8. U.S. Pat. No. 6,988,809 by Mario Rabinowitz, "Advanced Micro-Optics Solar Energy Collection System" issued on Jan. 24, 2006.
9. U.S. Pat. No. 6,987,604 by Mario Rabinowitz and David Overhauser, "Manufacture of and Apparatus for Nearly Frictionless Operation of a Rotatable Array of Micro-Mirrors in a Solar Concentrator Sheet" issued on Jan. 17, 2006.
10. U.S. Pat. No. 6,975,445 by Mario Rabinowitz, "Dynamic Optical Switching Ensemble" issued on Dec. 13, 2005.
11. U.S. Pat. No. 6,964,486 by Mario Rabinowitz, "Alignment of Solar Concentrator Micro-Mirrors" issued on Nov. 15, 2005.
12. U.S. Pat. No. 6,957,894 by Mario Rabinowitz and Felipe Garcia, "Group Alignment Of Solar Concentrator Micro-Mirrors" issued on Oct. 25, 2005.
13. U.S. Pat. No. 6,843,573 by Mario Rabinowitz and Mark Davidson, "Mini-Optics Solar Energy Concentrator" issued on Jan. 18, 2005.
14. U.S. Pat. No. 6,738,176 by Mario Rabinowitz and Mark Davidson, "Dynamic Multi-Wavelength Switching Ensemble" issued on May 18, 2004.
15. U.S. Pat. No. 6,698,693 by Mark Davidson and Mario Rabinowitz, "Solar Propulsion Assist" issued on Mar. 2, 2004.
16. U.S. Pat. No. 6,612,705 by Mark Davidson and Mario Rabinowitz, "Mini-Optics Solar Energy Concentrator" issued on Sep. 2, 2003.
17. Solar Energy Journal, Vol. 77, Issue #1, 3-13 (2004) "Electronic film with embedded micro-mirrors for solar energy concentrator systems" by Mario Rabinowitz and Mark Davidson.

DEFINITIONS

"Dielectric" refers to an insulating material in which an electric field can be sustained with a minimum power dissipation.

"Electric dipole" refers to the polarization of negative and positive charge. This may be permanent as with electrets, or induced.

"Electric field" or "electric stress" refers to a voltage gradient. An electric field can produce a force on charged objects, as well as neutral objects. The force on neutral objects results from an interaction of the electric field on intrinisic or induced electric polar moments in the object.

"Electrical breakdown" occurs when a high enough voltage or electric field is applied to a dielectric (vacuum, gas, liquid, or solid) at which substantial electric charge is caused to move through the dielectric.

"Electret" refers to a solid dielectric possessing persistent electric polarization, by virtue of a long time constant for decay of charge separation.

"Enhanced or macroscopic electric field" is the electric field enhanced by whiskers very near the electrodes based upon the local (microscopic) geometry on the surface of the electrodes.

"Gimbals are a two or more axis mount consisting of two or more rings mounted on axes at right angles to each other. An object mounted on a three ring gimbal can remain horizontally suspended on a plane between the rings regardless as to the stability of the base.

"Gimbal lock" occurs when two axes of rotation line up, depriving the availability of the other degree of freedom of rotation.

"Induced Electric dipole" refers to the polarization of negative and positive charge produced by the application of an electric field.

"Internal pivot point" herein means the ability to rotate in place without the need for an external affixed pivot or swivel. In the instant invention, spheroidal and planar solar cells such as disks, etc. have an internal pivot point for rotation inside hollow concentric cavities when acted on by an external field (e.g. to track the sun or other light sources).

"Macroscopic electric field" is the applied electric field on the basis of the imposed voltage and the gross (macroscopic) geometry of the electrodes, and which is relevant as long as one is not too near the electrodes.

"Photovoltaic Cell or Solar Cell or" is a device that converts light energy into electrical energy by the photovoltaic effect. As used herein, this includes associated wiring and electronic paraphernalia. Though commonly used interchangeably, photovoltaic is the more general term as the light source may be the sun or other source.

"Pivot or universal joint permitting many degrees of freedom for rotation about the pivot point. As taught in the instant invention, a preferred embodiment is to have the solar cells suspended below the pivot.

"Solar Cell or Photovoltaic Cell" is a device that converts light energy into electrical energy by the photovoltaic effect. As used herein, this includes associated wiring and electronic paraphernalia.

"Trough" refers to a two-dimensional trough solar cell array that tracks the sun and focuses sunlight onto a receiver.

SUMMARY OF THE INVENTION

In the pivoted solar cells with Induced Dipole Alignment that have been developed, the small solar cells are aligned to track the sun to capture more solar energy. These solar cells have dimensions small compared to the dimensions of the array. The array remains focused on the sun over the course of a day and throughout the year. The pivot point for rotation can be below, internal to, or located above the solar cells, giving the additional advantage of vertical stability. Vertical stability provides a natural fiducial or starting point, as well as enabling simpler and more efficient alignment. At startup for initial operation, or following a blackout, having the pivot point affixed above the solar cells gives them a natural quasi-vertical position since the center of mass of the solar cells is below the pivot suspension point. A given natural angle with respect to the vertical can be built in to the solar cells by weight distribution and/or constructing the solar cells with a cocked angle relative to their support stem. Such quasi-vertical positioning allows the solar cells to start from a nearly aligned position, rather than having to move over a much larger angle for alignment. Furthermore, the natural stability of a quasi-vertical position [as opposed to the natural stability of a quasi-horizontal position when the pivot point is below the solar cells] permits a substantial reduction in the latching force required to hold the solar cells in alignment between alignment operations.

There are many aspects and applications of this invention, which provides techniques applicable individually or in combination as an actuator, for motion control, and for positioning of the optical elements of a solar cell array and similar equipment. One broad general concept of this invention relates to the actuation, motion production and control, and positioning resulting from dipoles in general, i.e. electric, magnetic, induced, and permanent. The instant invention can perform dynamic motion control over a wide range of dimensions from nanometers to decimeters, i.e. from the nano-range, through the micro-range, through the mini-range to the macro-range. Another broad general concept of this invention relates to Induced Dipole Alignment for the actuation, motion production and control, and positioning of planar or spheroidal solar cells. The solar cells can have an under-layer made of a conductive metallic coating. In an applied electrostatic field, E, a dipole moment is induced in the metallic conducting material because the charge distributes itself so as to produce a field free region inside the conductor. To internally cancel the applied field E, free electrons move to the end of each conductor anti-parallel to the direction of E, leaving positive charge at the end that is parallel to the direction of E. Another way to think of this in equilibrium is that a good conductor cannot long support a voltage difference across it without a current source. Furthermore, an electrostatic field polarizes and aligns any dielectric associated with the solar cells, and any ancillary dielectric undercoating. An induced electrostatic dipole in an electrostatic field is somewhat analogous to an induced magnetic dipole in a pivoted ferromagnetic material in a magnetic field, which effect most people have experienced. When pivoted, a high aspect ratio (length to thickness ratio) ferromagnetic material rotates to align itself parallel to an external magnetic field. Another aspect of the instant invention is that the same alignment technique can be done magnetically with an induced magnetic dipole made of ferromagnetic material attached to solar cells, and/or an attached permanent dipole.

A permanent electret dipole can be attached beneath the solar cell to further enhance the dipole field that interacts with the addressable alignment fields.

Although the primary application of the instant invention is for a solar cell application, there are alternative applications where the light source is other than the sun.

In the adjustable solar cell with induced dipole alignment that has been developed, the induced dipole aligns the solar cells to follow the sun or other light source in order to increase or maximize the energy conversion.

Photovoltaic cells, convert the solar energy focused and delivered to them by the instant invention directly into electrical energy and then mechanical energy or heat.

There are many aspects and applications of this invention, which provides techniques applicable individually or in combination as an actuator, for motion control, and for positioning of solar cells and similar equipment. The broad general concept of this invention relates to motorless actuation, motion production and control, and positioning. The instant invention can perform dynamic motion control over a wide range of dimensions from nanometers to centimeters, i.e. from the nano-range, through the micro-range, through the mini-range to the macro-range in a broad scope of applications in micro-electro-mechanical systems (MEMS) such as a mini-solar cell array, and in similar equipment. Motorless motion, angular deflection, and continuous rotation can be achieved without recourse to magnetic fields thus eliminating the need for coils. Furthermore, the instant invention permits less costly and greater ease of manufacture while providing well-defined motion and position control.

It is a general aspect of this invention to provide a dynamic system for motion control of an optical system.

Another general aspect of this invention is to provide a positioning system of an optical system.

Another general aspect of this invention is provide a natural stable position of the solar cells by locating the pivot above the solar cells.

Another aspect of the instant invention provides a reduction in the latching force required to hold the solar cells in alignment between alignment operations.

Another aspect of this invention is to provide the motive force for an optical system.

Another aspect of the instant invention is to produce motorless motion of the elements of a solar cell array.

Another aspect of this invention is to cause motorless angular deflection of the elements of a solar cell array.

An aspect of the invention is to produce motorless continuous rotation of the elements of a solar cell array.

Other aspects and advantages of the invention will be apparent in a description of specific embodiments thereof, given by way of example only, to enable one skilled in the art to readily practice the invention singly or in combination as described hereinafter with reference to the accompanying drawings. In the detailed drawings, like reference numerals indicate like components.

GLOSSARY

The following is a glossary of components and structural members as referenced and employed in the instant invention with like reference alphanumerics indicating like components:

1—rotatable optical elements (including solar cell, and solar cell array)
2—solar cell
3—negative-end of an induced dipole or an electret dipole
4—positive-end of an induced dipole or an electret dipole 4—Array of tracking solar cells
5—body of the electret
5—mini-optics ensemble (with ridged egg-crate cells, not hollow cavities)
5t—top of a grid compartment
5b—bottom of a grid compartment
6—semi-sphere
6T—approximate cutoff point for the dielectric induced charge density
6B—approximate cutoff point for the dielectric induced charge density
7—solar cell modules
8—pivot bearing
8'—dielectric (such as glass or plastic)
9—universal pivot that can rotate or tilt in any direction
11—top ridged sheet (like an egg-crate)
11'—bottom ridged sheet (like an egg-crate)
14—transparent ground plane (such as Indium-Tin-Oxide)
15—cross sectional view of resistive grid
17—ridged sheet (contains optical elements within it)
18—lubricating fluid
19—concentric cavity
20—pressure applying means
21—conduit pipe
24—resistive grid wires
30—incident light (and sometimes also small amount of reflected light)
44—electronic control grid (in perspective)
45—transparent sheet on top of grid
E—electric field
d—total dipole moment of induced dipole in solar cell and electret dipole
D—total dipole moment of induced dipole in solar cell and induced dipole in dielectric
M—induced dipole moment in solar cell
V1,V2,V3,V4—voltage (number next to V indicates grid voltage location)
+—positive charge
−—negative charge

DETAILED DESCRIPTION OF THE PRESENTLY PREFERRED EMBODIMENTS

As is described here in detail, the objectives of the instant invention may be accomplished by any of a number of ways separately or in combination, as taught by the instant invention. A tracking solar cell array has been developed in which the orientation of individual optical elements (includes solar cells) is accomplished by or electric dipole and/or magnetic dipole interaction between the electric and/or magnetic field of a grid and an induced dipole, and/or a permanent dipole, to align them consecutively or concurrently without the need for expensive, bulky, and heavy motors. Thus the improved solar cell array of the instant invention can be less expensive, more reliable, and lighter in weight than solar cell arrays that would track by ordinary means.

Figure 1A:
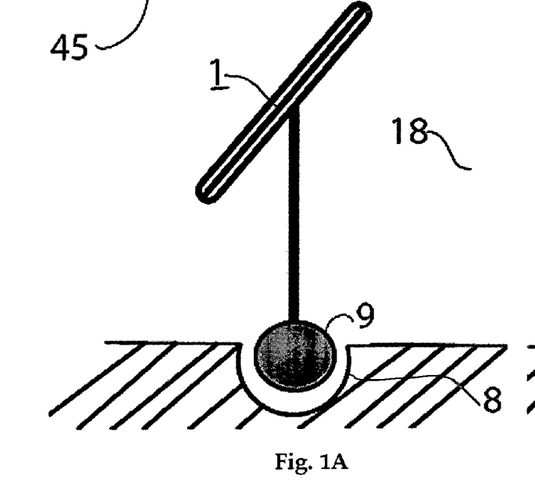
FIG. 1A is a side cross-sectional view of an angular deflection solar cell device, supported by an underneath universal pivot, for motorless alignment.

FIG. 1a is a side profile view of a rotatable element (includes solar cell) 1 immersed in a fluid 18 and supported by an underneath universal pivot 9 in a pivot bearing 8. A transparent sheet 45 forms a protective covering for the elements 1.

Figure 1B:
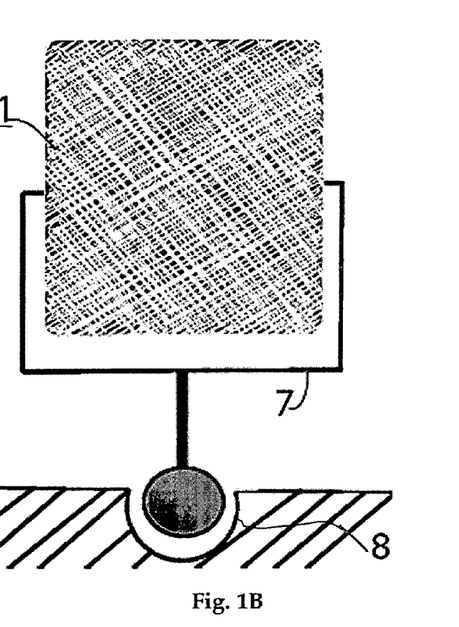
FIG. 1B is a front cross-sectional view of an angular deflection solar cell device, supported by gimbals with an underneath pivot, for motorless alignment.

FIG. 1b is a front cross-sectional view of an angular deflection solar cell 1 device, supported by gimbals 7 with an underneath pivot in a pivot bearing 8, for motorless alignment.

Figure 2A:
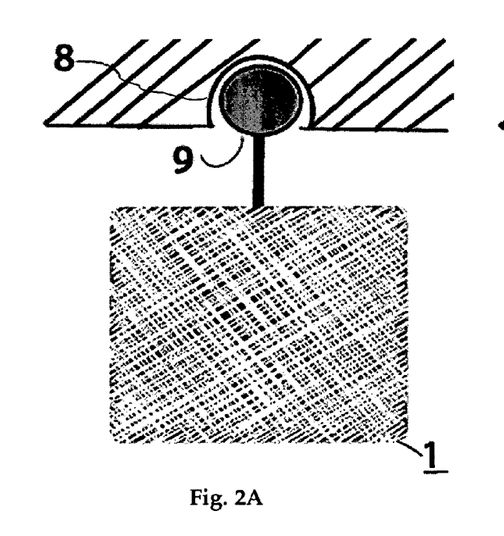
FIG. 2A is a front cross-sectional view of an angular deflection rectangular solar cell device, suspended by an overhead universal pivot, for motorless alignment.

FIG. 2a is a front cross-sectional view of an inverted rectangular planar or slightly concave optical element (includes solar cell) 1 suspended from a universal pivot 9 that can rotate or tilt in any direction, supported by a pivot bearing 8. This is one member of an adjustable solar cell array. The solar cell can be flat or slightly concave or oval. The advantage of overhead suspension with the pivot and bearing above the center of mass of each element is that it provides natural vertical stability to said optical elements. Alignment can be achieved by an Induced and/or permanent Dipole Force.

Figure 2B:
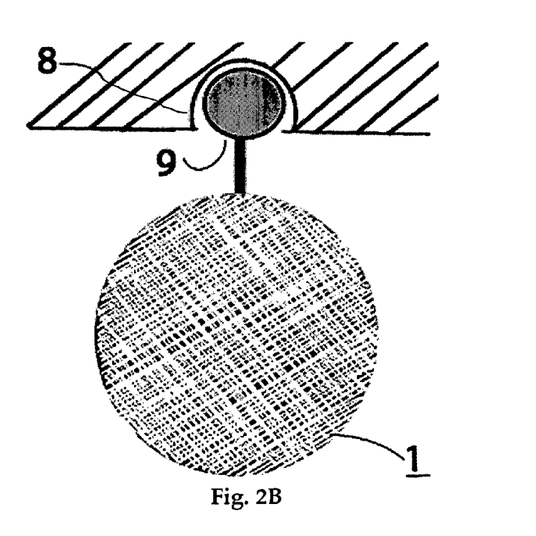
FIG. 2B is a front cross-sectional view of an angular deflection circular solar cell device, suspended by an overhead universal pivot, for motorless alignment.

FIG. 2b is a front cross-sectional view of an inverted circular approximately planar optical element (includes solar cell) 1 suspended from a universal pivot 9 that can rotate or tilt in any direction, supported by a pivot bearing 8. This is one member of an adjustable solar cell array. The solar cell can be flat or slightly concave. Alignment can be achieved by an Induced and/or permanent Dipole Force motorless alignment.

Figure 2C:
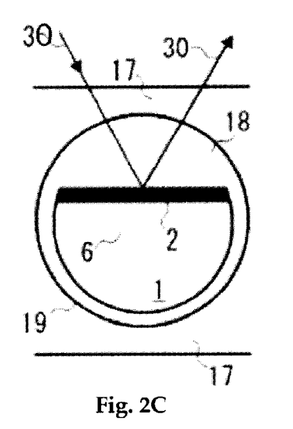
FIG. 2C is a cross-sectional view of a semi-sphere with a solar cell on its flat top. This element is encapsulated in a lubricated concentric cavity, and is one of a multitude of photovoltaic cells that can track a light source.

FIG. 2c is a cross-sectional view of a single rotatable optical element 1 which is a flat top semi-sphere 6 upon which is a solar cell 2 with rounded edges. The element 1 can also be semi-spheroidal, and is completely encompassed with a lubricating fluid 18 which is encapsulated inside a concentric cavity 19 in transparent sheet 17. Also shown is the incident light ray 30 and slightly reflected light ray 30. Alignment is achieved by an Induced and/or permanent Dipole Force motorless alignment.

Figure 2D:
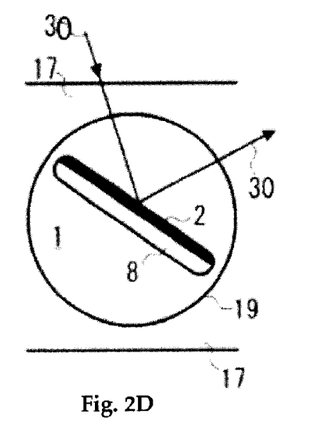
FIG. 2D is a cross-sectional view of a circular disk with a solar cell on the top surface of a dielectric. This element is encapsulated in a lubricated spheroidal cavity, and is one of a multitude of optical elements that can track a light source.

FIG. 2d shows a cross-sectional view of a circular disk rotatable optical element 1 with a circular disk solar cell 2 on the top of a dielectric 8, that is completely encompassed with a lubricating fluid which is encapsulated inside a concentric cavity 19 inside transparent sheet 17. The backing dielectric 8 is present to give the solar cell 2 increased mechanical strength. When the dielectric 8 has a high dielectric constant, it helps in the alignment process as explained in conjunction with FIGS. 3a, 3b, and 3c. The backing 8 may also be metallic, though a dielectric backing is preferred because of its lower mass density and lower cost. Also shown is the incident light ray 30 and the slightly reflected light ray 30. Alignment is achieved by an Induced and/or permanent Dipole Force motorless alignment.

Figure 2E:
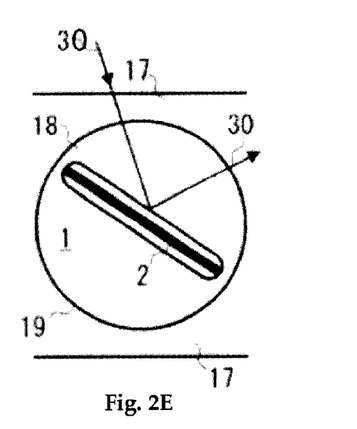
FIG. 2E is a cross-sectional view of a circular disk with an internal solar cell sandwiched between two dielectrics. This element is encapsulated in a lubricated spheroidal cavity, and is one of a multitude of optical elements that can track a light source and increase the received light.

FIG. 2e is a cross-sectional view of a circular disk rotatable optical element (includes solar cell) 1 sandwiched between two dielectrics 8 with rounded edges. The top dielectric 8 must be transparent. The element 1 is completely encompassed by a lubricating fluid 18 which is encapsulated inside a concentric cavity 19 inside a transparent sheet 17. Also shown is the incident light ray 30 and the slightly reflected light ray 30. This element is one of a multitude of optical elements that can track a light source and receive light onto a solar cell. Smooth stopping is an advantage naturally built into the operation of all the planar solar cell embodiments. The torque is proportional to the vector cross product of the dipole moment, applied electric field E, and sine of the angle between the vector dipole moment and the vector E. Thus the torque automatically goes to zero as a solar cell aligns itself with the applied electric field. Alignment is achieved by an Induced and/or permanent Dipole Force motorless alignment and can be an iterative process to maximize the amount of light energy received where an increase in the light signal guides the alignment.

Figure 2F:
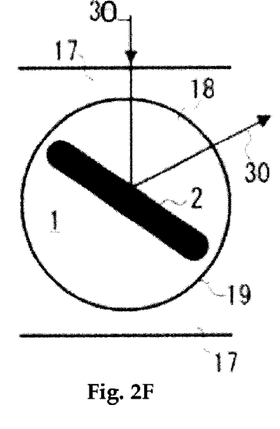
FIG. 2F is a cross-sectional view of a circular solar cell disk. This element is encapsulated in a lubricated spheroidal cavity, and is one of a multitude of solar cells which can track a light source.

FIG. 2f shows a cross-sectional view of a rotatable element 1 that is a circular disk solar cell 2 with rounded edges, that is completely encompassed by a lubricating fluid 18 which is encapsulated inside a concentric cavity 19 inside transparent sheet 17. Also shown is the incident light ray 30 and the somewhat reflected light ray 30. This solar cell is one of a multitude of optical elements which can track a light source and to increase the amount of received light. Alignment is achieved by an Induced and/or permanent Dipole Force motorless alignment.

Figure 2G:
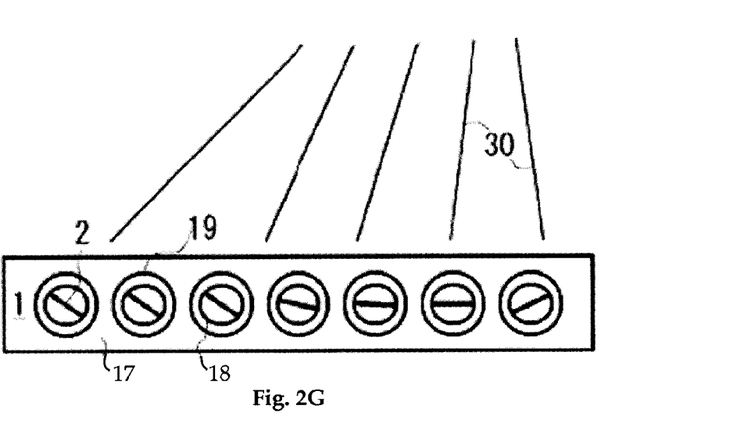
FIG. 2G is a cross-sectional view of an ensemble of solar cells encapsulated in lubricated cavities in a mini-optics photovoltaic converter. These solar cells have an internal pivot point for rotation so they can track the incident light.

FIG. 2g is a cross-sectional view of a solar cell array comprising an ensemble of elements 1 containing solar cells 2 encapsulated in lubricant 18 inside spherical cavities 19 in a transparent sheet 17. These transparent solar cells 2 are thus rotational with minimal friction, so they can increase the available light 30 received by the solar cells 2. Alignment is achieved by an Induced and/or permanent Dipole Force motorless alignment.

Figure 3A:
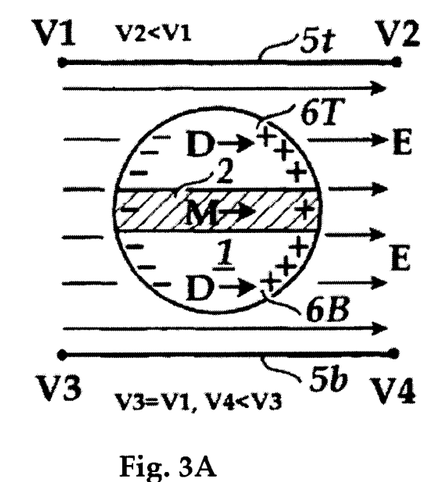
FIG. 3A is a schematic (not showing pivot, etc.) cross-sectional view of a rotatable element (includes solar cell) with induced dipole conductor and induced dipole dielectric aligned parallel to partitioned electrodes where an ensemble of such elements are a major constituent of a solar cell energy converter.

FIG. 3a is a schematic (not showing any external pivot, etc.) cross-sectional view of a rotatable element (includes solar cell) 1 in which a dipole moment M can be induced in the metallic part of the solar cell 2 together with an induced dipole D in the dielectric part of the solar cell and surrounding dielectric when the solar cell has both metallic and dielectric components. The alignment shown is parallel to the grid wires. When the solar cell is purely dielectric, only the dipole moment D is present. An electret dipole can also be present to further augment the total dipole moment. This further enhances the dipole field that interacts with the addressable alignment fields. The induced charge density in the dielectric tapers off perpendicular to the applied field, and 6T and 6B roughly depict the cutoff points for the induced charge density.

Also shown is a top surface of a grid compartment 5t and bottom surface of a grid compartment 5b, where an ensemble of such elements and electrodes are a major constituent of a pivoted solar cell array. The grid compartment is delineated by the grid electrodes (cf. FIGS. 4a and 4b). U.S. Pat. No. 6,964,486 by Mario Rabinowitz, "Alignment of Solar Concentrator Micro-Mirrors" issued on Nov. 15, 2005; and U.S. Pat. No. 7,187,490 by Mario Rabinowitz, "Induced Dipole Alignment Of Solar Concentrator Balls" issued on Mar. 6, 2007 describe the induced dipole coupling of solar cells and grid for purposes of tracking and focusing alignment.

A processor sends signals via bus bars to establish voltages from a power supply to each corner of a grid compartment (cf. FIGS. 4a and 4b) whose edges are grid electrodes made of a highly resistive thin conductor. At the top of the grid compartment 5t, the left corner is at voltage V1 and the right corner is at voltage V2. For the bottom of grid compartment 5b, the left corner is at voltage V3 and the right corner is at voltage V4 as shown. If a signal sets the voltages so that V3=V1, V4=V2, V2<V1, and V4<V3, this produces an approximately uniform applied electric field E parallel to the grid compartment faces 5t and 5b as shown.

The applied electric field E induces a dipole moment M in the metallic conducting material of the solar cells 2. This is because when a metallic conductor is placed in an electric field, the charge distributes itself so as to produce a field free region inside the conductor. To internally cancel the applied field E, negative − free electrons move to the end of each conductor opposite to the direction of E, leaving positive + charge at the end in the direction of E. The induced dipole moment D in the dielectric results from a similar polarization that tends to cancel the applied field E from the inside of the dielectric. The torque interaction of the induced electric dipole moment of the solar cell 2 and the electric field E acts to align the solar cells 2 parallel to the electric field E as shown here in FIG. 3a. The torque is proportional to the product of E and the net vector dipole moment of M and D and electret dipole (if present) which add together to produce a total dipole moment parallel to the solar cell 2, and parallel to the applied electric field E. The positive + end and the negative − end align themselves parallel to the electric field E due to the torque interaction of the net electric dipole moment and the applied electric field E, which is proportional to their product (equal to their vector product).

Figure 3B:
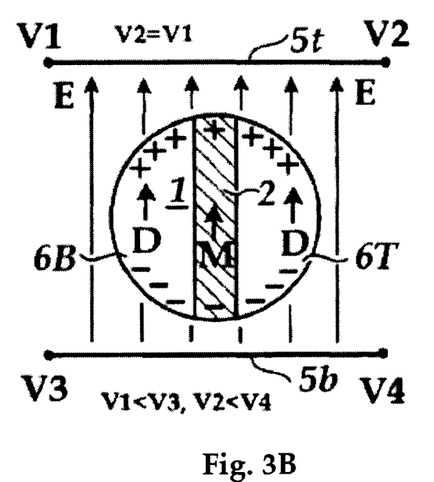
FIG. 3B is a schematic with internal pivot point (or affixed pivot not showing overhead pivot) cross-sectional view of a rotatable element (including solar cell) with induced conductor dipole and induced dielectric dipole aligned perpendicular to partitioned electrodes where an ensemble of such elements are a major constituent of a pivoted-optics converter.

FIG. 3b is a schematic (not showing any external pivot, etc.) cross-sectional view of a rotatable element (solar cell) 1 in which a dipole moment M can be induced in a conductor together with an induced dipole D in the dielectric part of the element 1 when the solar cell has both metallic and dielectric components. The alignment shown is perpendicular to the grid wires. An electret dipole 2 can also be present to further augment the total dipole moment. This further enhances the dipole field that interacts with the addressable alignment fields. The induced charge density in the dielectric tapers off perpendicular to the applied field, and 6T and 6B roughly depict the cutoff points for the induced charge density. Also shown is a top surface of a grid compartment 5t and bottom surface of a grid compartment 5b, where an ensemble of such elements and electrodes are a major constituent of a pivoted solar cell array. The grid compartment is specified by the grid electrodes (cf. FIGS. 4a and 4b).

A processor sends a signal that sets the voltages so that V2=V1, V1<V3, V2<V4, and V4=V3, this produces an approximately uniform applied electric field E parallel to the grid compartment faces 5t and 5b as shown.

Figure 3C:
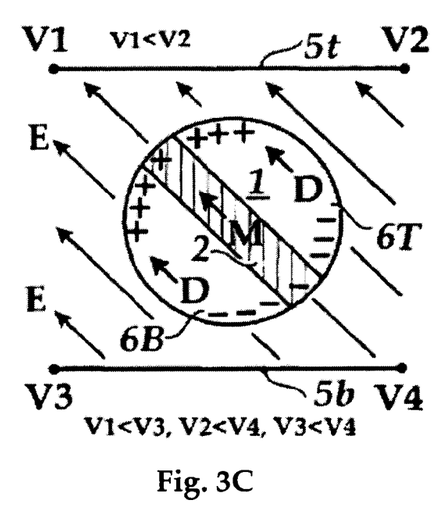
FIG. 3C is a schematic with internal pivot point (or affixed pivot, not shown) cross-sectional view of a rotatable element (including solar cell) with induced dipole conductor and induced dipole dielectric aligned at a tilted angle with respect to partitioned electrodes where an ensemble of such elements are a major constituent of a pivoted-optics converter.

FIG. 3c is a schematic (not showing any external pivot, etc.) cross-sectional view of a rotatable element (solar cell) 1 in which a dipole moment M can be induced in the in the metallic part of the solar cell 2 together with an induced dipole D in the dielectric part of the solar cell and surrounding dielectric when the solar cell has both metallic and dielectric components. The alignment shown is at a tilted angle with respect to the grid wires. When the solar cell is purely dielectric, only the dipole moment D is present. An electret dipole can also be present to further augment the total dipole moment. This further enhances the dipole field that interacts with the addressable alignment fields. The induced charge density in the dielectric tapers off perpendicular to the applied field, and 6T and 6B roughly depict the cutoff points for the induced charge density. Also shown is a top surface of a grid compartment 5t and bottom surface of a grid compartment 5b, where an ensemble of such elements and electrodes are a major constituent of a pivoted-optics solar cell array. The grid electrodes delineate the grid compartment (cf. FIGS. 4a and 4b).

A processor sends a signal that sets the voltages so that V1<V2, V1<V3, V2<V4, and V3<V4. This produces an approximately uniform applied electric field E tilted with respect to the grid compartment faces 5t and 5b as shown.

Figure 3D:
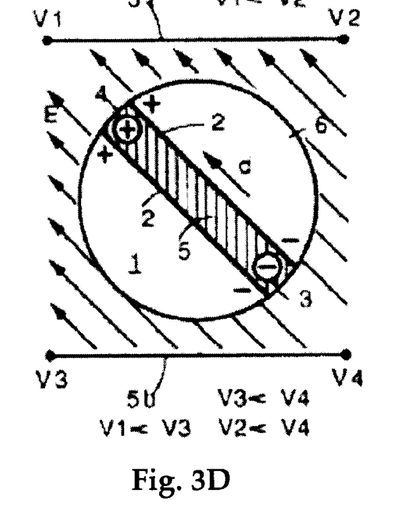
FIG. 3D is a schematic with internal pivot point (or affixed pivot, not shown) cross-sectional view of a rotatable element (including solar cell) with an electret dipole sandwiched between top and bottom solar cells, that are aligned at a tilted angle with respect to partitioned electrodes where an ensemble of such elements are a major constituent of a pivoted-optics array.

FIG. 3d is a schematic (not showing any external pivot, etc.) cross-sectional view of a rotatable element (including solar cell) 1 with an optional electret dipole 5 sandwiched between two solar cells 2 with induced dipole d in the solar cell and surrounding dielectric causes alignment at a tilted angle with respect to partitioned top grid electrode 5t and bottom grid electrode 5b, where an ensemble of such elements are a major constituent of a swiveled-optics solar cell array. The presence of two solar cells 2 allows rotation of the bottom solar cell 2 to the top, when the top solar cell 2 loses some of its functionality.

For the top of grid compartment 5t, the left corner is at voltage V1 and the right corner is at voltage V2. For the bottom of a grid compartment 5b, the left corner is at voltage V3 and the right corner is at voltage V4. A signal sets the voltages so that V1<V2, V2<V4, V1<V3, and V2<V4, producing an approximately uniform applied electric field E that is tilted with respect to the grid electrodes 5t and 5b as shown. The solar cell 2 aligns itself parallel to the electric field E due to the induced dipole field polarization of the dielectric, and permanent dipole of the electret 5. Two-axis tracking is possible by additional alignment of the solar cells 1 out of the plane of the paper. This is accomplished by similar voltage relationships to those already described as can be understood from the top and bottom electrode views shown in FIGS. 4*a* and 4*b*.

The optional electret 5 can be used to augment the torque. In equilibrium i.e. when the rotation is complete, the polarization due to the electret 5 and that due to the induced charges of the solar cells 2 add together as vectors to produce a total dipole moment d parallel to the solar cells 2, and parallel to the applied electric field E. The positive + end 4 and the negative − end 3 of the electret 5 align themselves parallel to the electric field E due to the interaction of the permanent electric dipole moment d of the electret 5 and the applied electric field E, which is proportional to their vector product. Since the body of the electret 5 and its dipole moment d are parallel to the solar cells 1, this torque interaction aligns the solar cells 2 parallel to the applied electric field E.

The presence of the optional electret 5, enhances the torque. In the absence of the electret 5, the dipole moment induced in the solar cells 1 can be sufficient to produce alignment. However, the additional torque provided by the electret 5 helps to overcome frictional effects.

A magnetic interaction that is analogous to the electrostatic interaction can also be used. A magnet can replace the electret, and an applied magnetic field can replace the applied electrostatic field. The torque would then result from the vector product of the total magnetic dipole and the magnetic field.

Figure 4A:
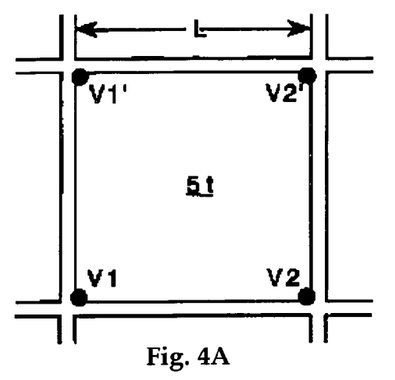
FIG. 4A is a schematic top view of an array of partitioned highly resistive electrodes showing in detail a top electrode of an electronic control grid for rotating the reflecting elements of a solar cell array or other similar optical equipment. (This schematic can represent either passive or active addressing as will be explained in the detailed description of FIG. 4c).

FIG. 4*a* represents a top view of an array of grid compartments with grid spacing L showing in detail a top view of one such top grid compartment 5*t* and the voltages at its four corners V1, V2, V1' and V2'. Voltages V1 and V2 correspond to voltages V1 and V2 shown in the cross sectional FIGS. 3*a*, 3*b*, 3*c*, and 3*d*. Voltages V1' and V2' are the voltages at the corners of this top of grid compartment 5*t* below the plane of the paper. Each grid electrode is made of a highly resistive thin conductor that hardly occludes light.

Figure 4B:
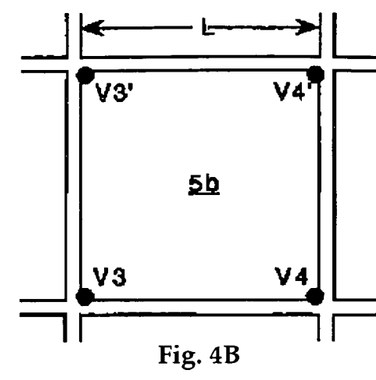
FIG. 4B represents a bottom view of an array of partitioned highly resistive electrodes showing in detail a view of a bottom electrode and the voltages at its four corners.

FIG. 4*b* represents a bottom view of an array of grid compartments delineated by highly resistive electrodes with grid spacing L showing in detail a view of a bottom electrode 5*b* and the voltages at its four corners V3, V4, V3' and V4'. Voltages V3 and V4 correspond to voltages V3 and V4 shown in the cross sectional FIGS. 3*a*, 3*b*, 3*c*, and 3*d*. Voltages V3' and V4' are the voltages at the corners of this bottom electrode 5*b* below the plane of the paper.

Figure 4C:
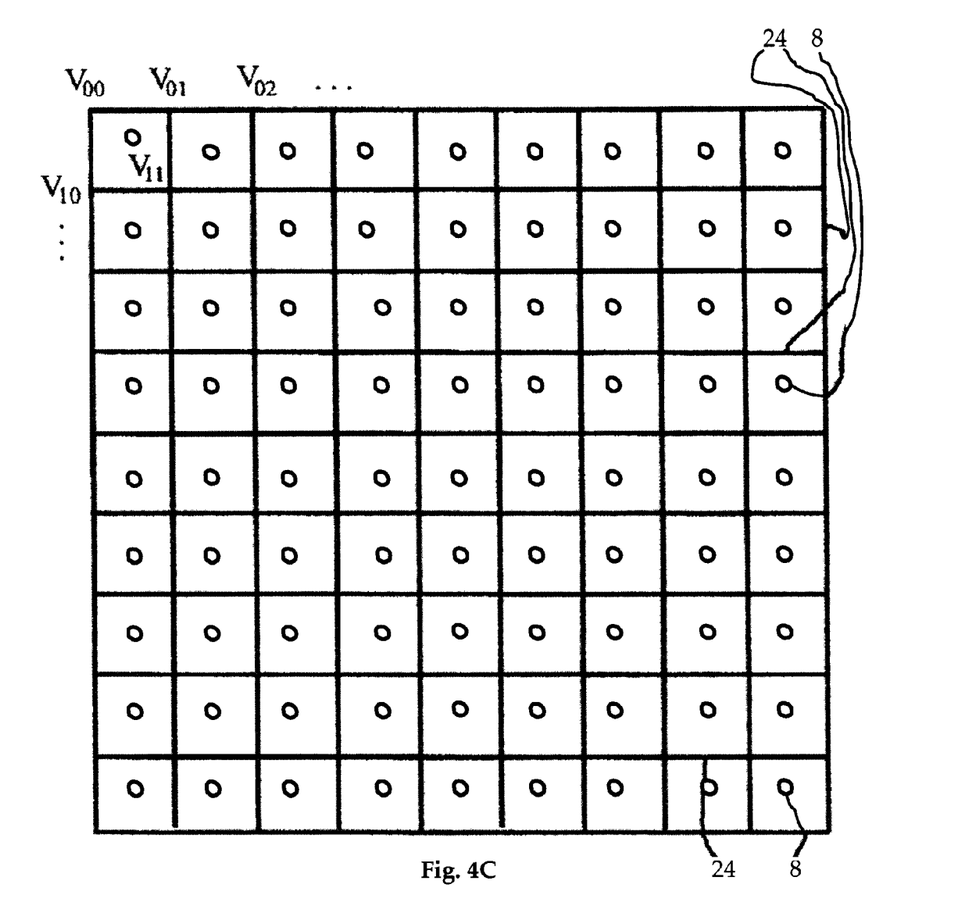
FIG. 4C is a schematic top view showing a generic electronic control grid that may represent a number of different kinds of transistorless grids; or grids with transistors at junctions, for matrix addressing and alignment of the optical elements of a solar cell array or other similar optical equipment. Also shown schematically are the pivot bearings of the transparent material which support the solar cells and the grid.

FIG. 4*c* is a schematic top view showing an electronic control grid with resistive grid wires 24 for either passive or active addressing matrix addressing and alignment of the optical elements of a solar cell array or other similar optical equipment. Also shown schematically are the pivot bearings 8 which support the pivots (described earlier with pivots designated as 9). The term "equipment" is used in the instant invention to stand for other types of tracking photovoltaic devices requiring addressing and alignment, that receive light from sources other than the sun.

This grid can be laid on the bottom of the equipment, on the top and bottom of the equipment, on the top of the equipment with a ground plane on the bottom of the equipment, etc. In order to avoid having several similar looking figures, this schematic may be thought of as a representation of any one of several addressing grid arrays. It can be a passive matrix wire grid array with one set of parallel wires on top of the equipment, separated and insulated from an orthogonal set of wires (that are parallel to each other) on the bottom of the equipment. Alternatively it can be an actual interconnected active matrix grid with Thin Film Transistors (TFTs), tunneling junction transistors (as used in flash memories), or similar devices at each of the grid junctions. In this case it is preferable to use Polymer based transistors for flexibility. The grid may be a segmented array with each square being a separate insulated slab (cf. to U.S. Pat. No. 6,964,486). In this case, the horizontal and vertical lines shown in this figure represent insulation between adjacent segments or slabs. The common element of all of these embodiments is the ability to impress the voltage Vij at the ij th node either statically or by means of a traveling wave. To minimize power dissipation, it is desirable to make the grid electrodes (edges) that delineate the grid compartments such as 5*t* and 5*b* of FIGS. 3*a*, 3*b*, 3*c*, and 3*d* highly resistive so that a given voltage drop is accomplished with a minimum of current flow and hence with a minimum of power dissipation. The bus bars that bring the voltage to the grid electrodes may have a higher conductivity (lower resistance).

Figure 4D:
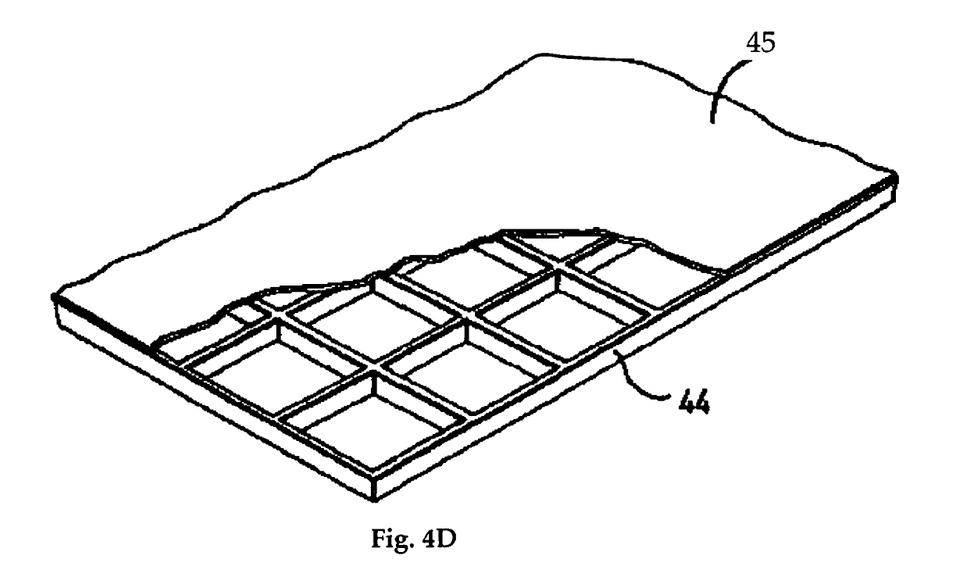
FIG. 4D is a cut-away perspective of a schematic control grid showing a transparent sheet on top of the grid.

FIG. 4*d* is a cut-away perspective of a schematic electronic control grid 44 showing a transparent sheet 45 on top of the grid 44. The sheet 45 performs at least three functions. The primary function of the transparent sheet 45 is to house the pivot bearings 8 shown in FIGS. 2*a* and 2*b*, which in turn support the universal pivots 9. The bearings 8 and pivots 9 are not shown in this FIG. 4*d* to keep this figure uncluttered in showing just the voltage carrying electronic grid 44, and the transparent sheet 45; and because this configuration also applies to the internal pivot point embodiments. The sheet 45 also protects the optical elements (solar cells), and permits an uninterrupted duty cycle of the solar cell array, as the transparent sheet can be cleaned when it becomes grimy, while the solar cells continue to perform their duty. The sheet 45 also functions to seal in a fluid such as vacuum, oil, elevated pressure gas, etc. to increase the dielectric strength (breakdown voltage) of the grid/optical element ensemble. This is explained in the *McGraw-Hill Encyclopedia of Science & Technology*, article on Electrical Insulation by Mario Rabinowitz in any of the editions from 1982-20002.

Figure 5A:
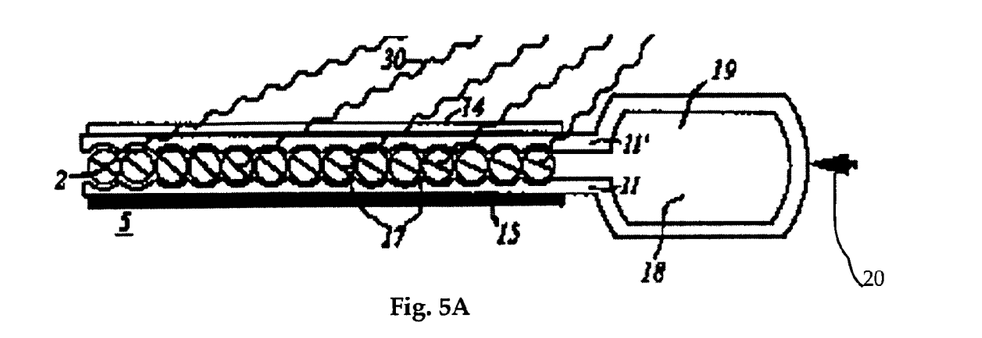
FIG. 5A is a cross-sectional view of a mini-optics egg-crate ensemble of solar cells showing the overlay of a transparent ground plane on top and a resistive grid on the bottom to locally produce varying mini-electric fields for orienting the solar cells to actively receive incident light.

FIG. 5*a* is a cross-sectional view of a mini-optics ensemble 5 of an individually rotatable monolayer of elements 1 (includes solar cells) showing the overlay of a transparent ground plane 14 on top and a resistive grid 15 on the bottom to locally produce varying mini-electric fields for orienting the mini-solar cells 2 to track the incident light 30. The rotatable elements 1 are situated in a ridged sheet 17 between two elastomer sheets. For spherical or cylindrical elements 1, the cellular structure in the ridged sheet 17 is conducive to holding the elements in grid position in the array structure. For elements 1 of disk shape, the ridged sheet 17 is a valuable adjunct in maintaining the array structure and avoiding binding between the elements. When rotation of the solar cells 2 is desired, the effect of the torque applied by the field can be augmented by injecting a fluid 18 from a plenum hollow cavity reservoir 19 by a pressure applying means 20 to expand the separation of the top sheets 11 and bottom sheets 11'. It is desirable to utilize a fluid 18 whose index of refraction matches the transparent dielectric adjacent to the solar cell 2. In addition to providing a means to pressure the elastomer sheets 11 and 11' apart, the fluid 18 acts as a lubricant to permit the elements to rotate freely when being guided into the proper orientation.

The sheets of ridged cells 17 can be created in thermoplastic elastomer sheets 11 and 11' by heating the sheets to a slightly elevated temperature and applying pressure with the elements between the sheets 11 and 11'. In the case of elements of hemispherical shape, the ridged cells 17 can be created on each sheet individually.

Figure 5B:
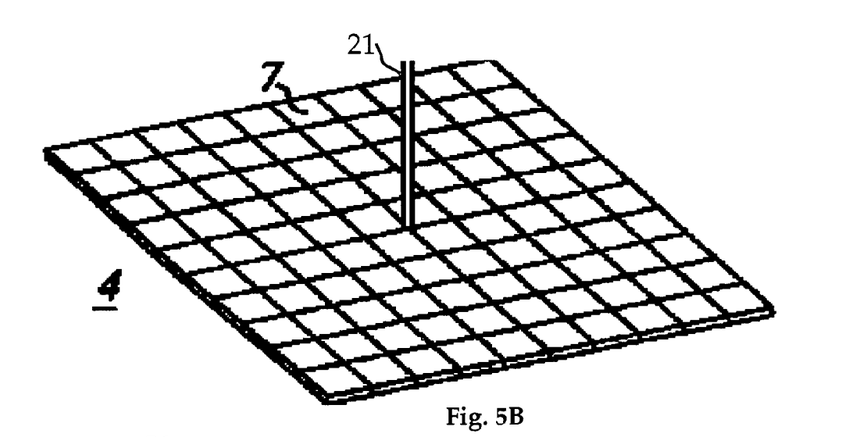
FIG. 5B is a perspective illustration of a solar cell array that tracks the light source, with conduit pipe in the middle.

FIG. 5b is a perspective view of a solar cell system 4 of solar cell modules 7 consisting of solar cells in a grid. The conduit pipe 21 can serve as a conduit for electrical power to the grid and from the solar cell array 4. The solar cell system 4 may be a single large monolitic configuration, or as shown, it is preferably made up of separate modules 7 which are fastened together and secured to an existing surface such as the ground or rooftop. This facilitates maintenance and repair operations when needed. Thus it is only necessary to remove one or more modules that need to be worked on, rather than disabling the entire solar cell system 4. The ensemble of solar cells and confining sheets may be replaced, while retaining the addressing electronics system. Furthermore this modular design also allows the solar cell system 4 to be built up easily to increase the output power. Another advantage of this modular design is that the separate modules 7 can be much more easily transported from the factory to the installation site, than would a large monolithic solar cell array.

The solar cell system 4 can be scaled from micro size to macro size. The limit on smallness (e.g. <~millimeters) is determined by the smallness of the optical elements (including solar cells). Small units may be operated together as a system. The macro limit may be in the hundreds of meters with structural and economic limits determining the maximum size of a given large unit. For practicality of an overall large system, many modular medium sized units would be preferable.

The solar cell system 4 may be secured to the ground or any existing structure such as a roof, side of a building, etc. It is desirable to give the solar collection system 4 a small incline for a number of reasons including gravitational removal of water that may collect on it. This can be done on both flat and inclined roof tops without the growth of vegetation under it. However on the ground, it is preferable to have the system 4 immediately adjacent to the ground to prevent growth of vegetation under it. This can be accomplished by grading of the ground slope prior to installation of the solar cell system 4.

Figure 5C:
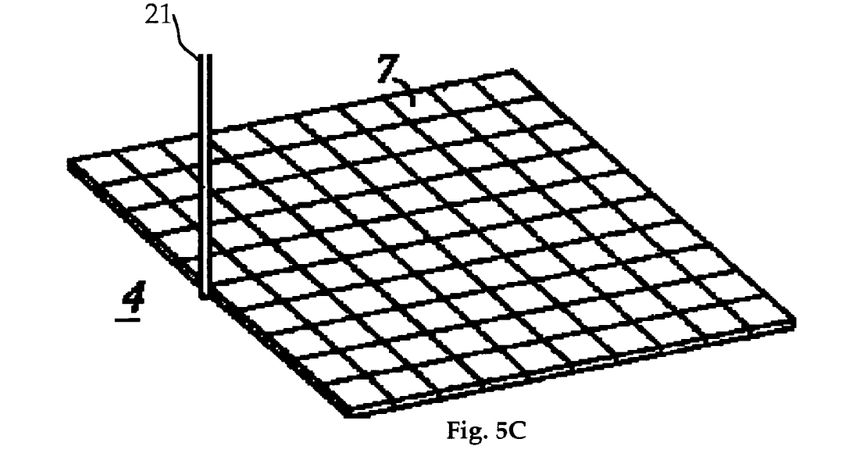
FIG. 5C is a perspective illustration of a solar cell array that tracks the light source, with conduit pipe at one end.

FIG. 5c is a perspective view of a solar cell system 4 of solar cell modules 7 consisting of solar cells in a grid just as in FIG. 5a. In this case the conduit pipe 21 that serves as a conduit for electrical power to the grid and from the solar cell array 4, is off to the side rather than in the middle as in FIG. 5a.

Rather than spheroidal elements, cylindrical elements can be used. This reduces the degrees of freedom from 2-axis tracking to 1-axis tracking, which is adequate for some purposes.

SCOPE OF THE INVENTION

While the instant invention has been described with reference to presently preferred and other embodiments, the descriptions are illustrative of the invention and are not to be construed as limiting the invention. Thus, various modifications and applications may occur to those skilled in the art without departing from the true spirit and scope of the invention as summarized by the appended claims together with their full range of equivalents. It is to be understood that in said claims, ingredients recited in the singular are intended to include compatible combinations of such ingredients wherever the sense permits. It should be recognized that the methods and apparatus of this invention can be used in other contexts than those explicitly described herein. It is also to be understood that the following claims are intended to cover all of the generic and specific features of the invention herein described, and all statements of the scope of the invention which, as a matter of language, might be said to fall there between.

The invention claimed is:

1. A solar cell system comprising:
   (a) an array of adjustable solar cells;
   (b) each of said solar cells being supported by at least one pivot rotatable in at least two directions;
   (c) said solar cells being coupled to dipole coupling devices via a dipole linkage;
   (d) said dipole coupling devices producing a propelling force via said dipole linkage;
   (e) said force producing rotation of said solar cells to track sunlight;
   (f) said dipole coupling devices being selected from the group consisting of induced dipole coupling devices and permanent dipole coupling devices;
   (g) said dipole coupling devices being coupled to an electronic control grid;
   (h) said solar cells being configured to rotate within the volume of the control grid.

2. The apparatus of claim 1, wherein said array of adjustable solar cells is covered by a transparent sheet.

3. The apparatus of claim 1, wherein said solar cells are contained in a fluid consisting of at least one of the group consisting of vacuum, oil, and elevated pressure gas.

4. The apparatus of claim 1, wherein said solar cells are mounted on gimbals.

5. The apparatus of claim 1, wherein at least one of said solar cells is adjacent to a
   dielectric to increase said dipole coupling.

6. The apparatus of claim 1, wherein said dipole linkage is electric.

7. The apparatus of claim 1, wherein said dipole linkage is magnetic.

8. A photovoltaic apparatus comprising:
   a) an array of photo cells configured to rotate in at least two directions within the volume of a control grid;
   b) said photo cells substantially receiving at least a portion of light signal from a light source;
   c) said photo cells having pivot points;
   d) said control grid providing electromagnetic linkage to rotate said photo cells;
   e) said linkage producing a rotational torque in at least two directions;
   f) at least one of said photo cells coupled to said linkage;
   g) said torque producing an alignment of said photo cells to track light source; and
   h) said photo cells producing non-radiant energy.

9. The apparatus of claim 8, wherein said linkage is one of the group consisting
   of an induced dipole, a permanent dipole, an electric dipole, and a magnetic dipole.

10. The apparatus of claim 8, wherein the signal from the light source helps to guide the alignment by means of an iterative feedback process.

11. The apparatus of claim 8, wherein said photo cells are mounted on gimbals.

12. The apparatus of claim 8, wherein said photo cells are joined to an isolated conductor.

13. The apparatus of claim 8, wherein said photo cells are joined to a dielectric material for coupling to an electrostatic field.

14. The apparatus of claim 8, wherein said pivot points are above the photo cell, internal to the photo cell, or below the photo cell.

15. The apparatus of claim 8, wherein the said photo cells are covered by a transparent sheet.

16. A system for converting light directly to electricity comprising:
   a) an array of photo cells, each photo cell having at least two degrees of rotational freedom;
   b) said photo cells substantially receiving at least a portion of light signal from a light source;
   c) said photo cells having pivot points;
   d) said photo cells being within a volume defined by a control grid;
   e) said control grid providing electromagnetic linkage to rotate said photo cells;
   f) said linkage producing a rotational torque in at least two directions;
   g) at least one of said photo cells being coupled to said linkage; and
   h) said torque producing an alignment of said photo cells to track said light source.

17. The apparatus of claim 16, wherein said linkage is a dipole.

18. The apparatus of claim 16, wherein said photo cells rotate inside hollow spheroids.

19. The apparatus of claim 16, wherein said photo cells are joined to a dielectric material for coupling to an electrostatic field.

20. The apparatus of claim 16, wherein said pivot points are above the photo cell or below the photo cell.

\* \* \* \* \*